(12) United States Patent
Isobe

(10) Patent No.: US 12,125,860 B2
(45) Date of Patent: Oct. 22, 2024

(54) IMAGE SENSOR, METHOD OF MANUFACTURING THE SAME, AND ELECTRONIC APPARATUS

(71) Applicant: SONY CORPORATION, Tokyo (JP)

(72) Inventor: Hiroshi Isobe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 121 days.

(21) Appl. No.: 17/072,590

(22) Filed: Oct. 16, 2020

(65) Prior Publication Data

US 2021/0183927 A1 Jun. 17, 2021

Related U.S. Application Data

(62) Division of application No. 15/546,829, filed as application No. PCT/JP2016/052591 on Jan. 29, 2016, now abandoned.

(30) Foreign Application Priority Data

Feb. 13, 2015 (JP) .................................. 2015-026496

(51) Int. Cl.
  *H01L 27/146* (2006.01)
  *H04N 23/57* (2023.01)
(52) U.S. Cl.
  CPC .. *H01L 27/14618* (2013.01); *H01L 27/14607* (2013.01); *H01L 27/14683* (2013.01); *H04N 23/57* (2023.01)
(58) Field of Classification Search
  CPC ......... H01L 27/14607; H01L 27/14618; H01L 31/1016; H01L 31/0203;

(Continued)

(56) References Cited

U.S. PATENT DOCUMENTS 8,013,350 B2 *  9/2011  Itoi ........................ H04N 23/51
                                                        257/E33.071
10,748,947 B2   8/2020  Masuda et al.
(Continued)

FOREIGN PATENT DOCUMENTS

CN    101241921 A      8/2008
EP     2854177 A1 *    4/2015   ....... H01L 27/14618
(Continued)

OTHER PUBLICATIONS

Notice of Allowance in U.S. Appl. No. 15/546,829 dated Feb. 28, 2022.

(Continued)

*Primary Examiner* — Younes Boulghassoul
*Assistant Examiner* — Quinton A Brasfield
(74) *Attorney, Agent, or Firm* — CHIP LAW GROUP

(57) ABSTRACT

An image sensor that includes a sensor substrate provided with a sensor surface on which a photodiode is arranged in a planar manner, a sealing resin applied to a side of the sensor surface of the sensor substrate, sealing glass bonded to the sensor substrate via the sealing resin, and a reinforcing resin made of a resin material having higher rigidity than the sealing resin and formed on an outer periphery of the sealing resin to bond the sensor substrate and the sealing glass. The sealing resin is formed to have a smaller area than each of the sensor substrate and the sealing glass, so that the reinforcing resin is formed to fill a gap provided on the outer periphery of the sealing resin, the sensor substrate and the sealing glass facing each other through the gap.

5 Claims, 8 Drawing Sheets

(58) Field of Classification Search
CPC ..... H01L 31/145–153; H01L 27/14634; H01L 27/14687; H01L 2224/28105; H01L 23/02; H01L 23/041–043; H01L 23/053; H01L 23/16–26; H01L 2924/151–1511; H01L 2924/15151; H05K 2201/10–10992
See application file for complete search history.

(56) References Cited

U.S. PATENT DOCUMENTS

| | | | |
|---|---|---|---|
| 2002/0092991 A1* | 7/2002 | Izumi | H01L 27/14618 257/E27.146 |
| 2004/0065952 A1* | 4/2004 | Prior | H04N 23/55 257/724 |
| 2008/0185603 A1* | 8/2008 | Itoi | H01L 31/0203 257/E33.059 |
| 2008/0197438 A1* | 8/2008 | Chan | H01L 27/14687 257/434 |
| 2008/0303107 A1* | 12/2008 | Minamio | H01L 27/14632 257/E31.127 |
| 2010/0025791 A1* | 2/2010 | Ogawa | H01L 27/14618 257/E31.127 |
| 2010/0117181 A1* | 5/2010 | Kim | H01L 27/14632 257/E31.127 |
| 2011/0073975 A1* | 3/2011 | Mukaida | H01L 27/14618 257/E31.127 |
| 2011/0285003 A1 | 11/2011 | Itoi et al. | |
| 2013/0141606 A1 | 6/2013 | Shimizu | |
| 2015/0130083 A1* | 5/2015 | Park | H01L 23/3157 438/109 |
| 2016/0079201 A1* | 3/2016 | Do | H01L 24/81 29/830 |
| 2016/0148879 A1* | 5/2016 | Saxod | H01L 24/81 438/118 |
| 2016/0340561 A1* | 11/2016 | Ikeda | H01L 23/293 |

FOREIGN PATENT DOCUMENTS

| | | |
|---|---|---|
| JP | 2001-250889 A | 9/2001 |
| JP | 2008-219854 A | 9/2008 |
| JP | 2009-064839 A | 3/2009 |
| JP | 2013-118230 A | 6/2013 |
| WO | 2006/062195 A1 | 6/2006 |

OTHER PUBLICATIONS

International Search Report and Written Opinion of PCT Application No. PCT/JP2016/052591, issued on Apr. 12, 2016, 9 pages of English Translation and 8 pages of ISRWO.
Non-Final Office Action for U.S. Appl. No. 15/546,829, issued on Aug. 9, 2018, 8 pages.
Non-Final Office Action for U.S. Appl. No. 15/546,829, issued on May 30, 2019, 9 pages.
Non-Final Office Action for U.S. Appl. No. 15/546,829, issued on Mar. 11, 2020, 12 pages.
Final Office Action for U.S. Appl. No. 15/546,829, issued on Jan. 11, 2019, 10 pages.
Final Office Action for U.S. Appl. No. 15/546,829, issued on Nov. 22, 2019, 11 pages.
Final Office Action for U.S. Appl. No. 15/546,829, issued on Jun. 23, 2020, 13 pages.
Advisory Action for U.S. Appl. No. 15/546,829, issued on Mar. 19, 2019, 3 pages.
Advisory Action for U.S. Appl. No. 15/546,829, issued on Feb. 14, 2020, 3 pages.
Advisory Action for U.S. Appl. No. 15/546,829, issued on Sep. 23, 2020, 3 pages.
International Preliminary Report on Patentability of PCT Application No. PCT/JP2016/052591, issued on Aug. 24, 2017, 9 pages of English Translation and 5 pages of IPRP.
Non-Final Office Action for U.S. Appl. No. 15/546,829 dated Nov. 4, 2020.
Non-Final Office Action for U.S. Appl. No. 15/546,829 dated Aug. 9, 2021.
Final Office Action for U.S. Appl. No. 15/546,829, issued on Mar. 8, 2021, 12 pages.

* cited by examiner

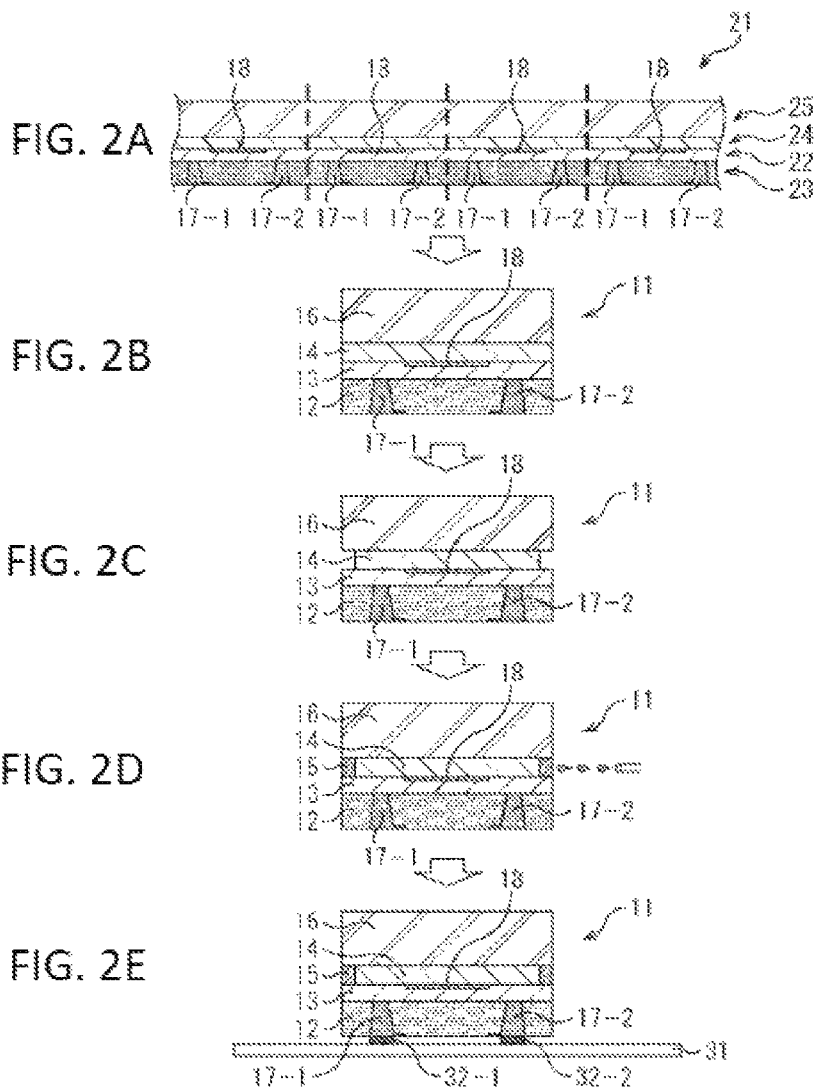

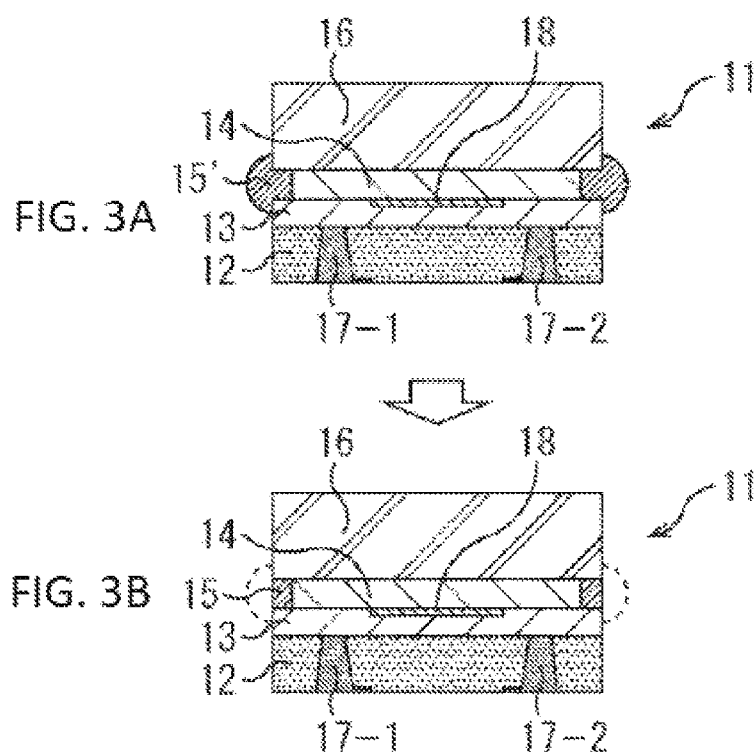

IMAGE SENSOR, METHOD OF MANUFACTURING THE SAME, AND ELECTRONIC APPARATUS

This application is a divisional application of U.S. patent application Ser. No. 15/546,829, filed on Jul. 27, 2017, which is a U.S. National Phase of International Patent Application No. PCT/JP2016/052591, filed on Jan. 29, 2016, which claims priority benefit of Japanese Patent Application No. JP 2015-026496, filed in the Japan Patent Office on Feb. 13, 2015. Each of the above-referenced applications is hereby incorporated herein by reference in its entirety.

TECHNICAL FIELD

The present disclosure relates to an image sensor, a method of manufacturing the image sensor, and an electronic apparatus, and particularly to an image sensor, a method of manufacturing the image sensor, and an electronic apparatus where reliability of the image sensor can be further improved.

BACKGROUND ART

A conventional solid-state imaging device, which is one of the major optical devices, includes an optical element having a large number of photodiodes and microlenses on a semiconductor wafer, and is formed by forming electrical wiring and then molding the wafer airtight with glass. Such a solid-state image sensor is used as a photosensor of a digital video device such as a digital still camera, a mobile phone camera, or a digital video camera.

Moreover, a recent solid-state imaging device has a structure adopting a wafer level chip size package (CSP) technology in which electrical connection is secured by forming through electrodes and rewiring in assembly processing of the sensor in a wafer state. The solid-state imaging device formed by the wafer level CSP technology allows the video device to have smaller size and thickness as well as higher density packaging compared to a ceramic or plastic package which secures electrical connection by die bonding or wire bonding as in the related art.

Patent Document 1 for example discloses a method of manufacturing an image sensor by applying a sealing resin to a substrate in a wafer state, bonding glass thereto, thermosetting the sealing resin, and then dicing and cutting out the wafer into individual pieces.

CITATION LIST

Patent Document

Patent Document 1: Japanese Patent Application Laid-Open No. 2009-64839

SUMMARY OF THE INVENTION

Problems to be Solved by the Invention

Now, in the aforementioned method of manufacturing the sensor by bonding glass to the substrate in the wafer state and then curing the sealing resin, the use of a sealing resin having high rigidity causes an increase in warpage of the wafer by thermal contraction at the time of curing the resin and thus sometimes causes a problem at the time of transferring the wafer. On the other hand, the use of a sealing resin having low rigidity causes an increase in the deformation of the sealing resin at low temperature due to a difference in linear expansion coefficients between glass and the sensor substrate in a low temperature reliability test on the image sensor after being diced into individual pieces, whereby peeling is more likely to occur in some cases.

It is thus required to improve the reliability of the image sensor by preventing such a problem arising at the time of transferring the wafer as well as preventing the peeling from occurring easily.

The present disclosure has been made in view of such circumstances, and is intended to further improve the reliability of the image sensor.

Solutions to Problems

An image sensor according to one aspect of the present disclosure includes: a sensor substrate provided with a sensor surface on which a photodiode is arranged in a planar manner; a seal member applied to a side of the sensor surface of the sensor substrate; a sealing member bonded to the sensor substrate via the seal member; and a reinforcing member made of a material having higher rigidity than the seal member and formed on an outer periphery of the seal member to bond the sensor substrate and the sealing member.

In a manufacturing method according to one aspect of the present disclosure, a sensor substrate provided with a sensor surface on which a photodiode is arranged in a planar manner is bonded to a sealing member via a seal member applied on a side of the sensor surface of the sensor substrate, the method including a step of forming, on an outer periphery of the seal member, a reinforcing member made of a material having higher rigidity than the seal member to bond the sensor substrate and the sealing member.

An electronic apparatus according to one aspect of the present disclosure includes: a sensor substrate provided with a sensor surface on which a photodiode is arranged in a planar manner; a seal member applied to a side of the sensor surface of the sensor substrate; a sealing member bonded to the sensor substrate via the seal member; and a reinforcing member made of a material having higher rigidity than the seal member and formed on an outer periphery of the seal member to bond the sensor substrate and the sealing member.

In one aspect of the present disclosure, the seal member is applied to the side of the sensor surface, on which the photodiode is arranged in a planar manner, of the sensor substrate, which is then bonded to the sealing member via the seal member, and the reinforcing member made of a material having higher rigidity than the seal member is formed on the outer periphery of the seal member to bond the sensor substrate and the sealing member.

Effects of the Invention

According to one aspect of the present disclosure, the reliability of the image sensor can be further improved.

BRIEF DESCRIPTION OF DRAWINGS

FIGS. 2A, 2B, 2C, 2D, and 2E are a set of diagrams illustrating a method of manufacturing the image sensor.

FIGS. 3A and 3B are a set of diagrams illustrating a method of forming a reinforcing resin.

MODE FOR CARRYING OUT THE INVENTION

Specific embodiments to which the present technology is applied will now be described in detail with reference to the drawings.

Figure 1A:
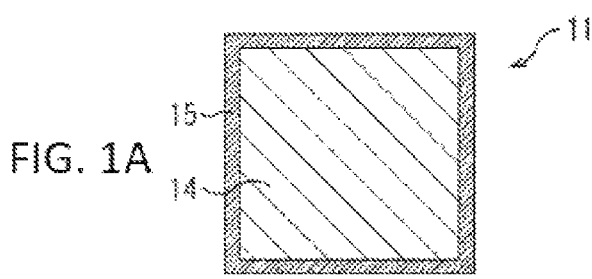
FIGS. 1A and 1B are diagrams illustrating an example of the configuration of a first embodiment of an image sensor to which the present technology is applied.
Figure 1B:
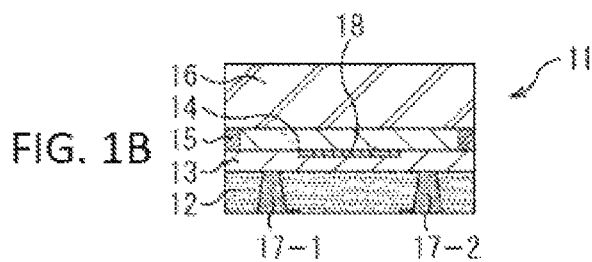

FIGS. 1A and 1B are diagrams illustrating an example of the configuration of a first embodiment of an image sensor to which the present technology is applied. FIG. 1A illustrates an example of a planar configuration of the image sensor, and FIG. 1B illustrates an example of a cross-sectional configuration of the image sensor As illustrated in FIG. 1B, an image sensor 11 is formed of a support substrate 12, a sensor substrate 13, a sealing resin 14 and a reinforcing resin 15, and sealing glass 16 that are laminated in this order from the bottom. The image sensor 11 is further provided with through electrodes 17-1 and 17-2 passing through the support substrate 12 to extract a signal from the sensor substrate 13. Note that the image sensor 11 is a backside illumination complementary metal oxide semiconductor (CMOS) image sensor in which a sensor surface 18 is irradiated with light, the sensor surface being provided on a backside (an upper surface in FIG. 1B) facing away from the surface of the sensor substrate 13 on which a wiring layer is laminated.

The support substrate 12 is bonded to the surface of the sensor substrate 13 processed with a thin film from the back side, and supports the sensor substrate 13.

The sensor substrate 13 is provided with the sensor surface 18, on which a plurality of photodiodes is arranged in a planar manner, on the backside of the substrate and outputs a pixel signal corresponding to light received by each photodiode through the wiring layer laminated on the surface side of the substrate.

The sealing resin 14 is formed by applying a resin material having low rigidity to the backside of the sensor substrate 13 in order to bond the sealing glass 16 to the sensor surface 18 of the sensor substrate 13. Moreover, the sealing resin 14 is formed to have a smaller area than each of the sensor substrate 13 and the sealing glass 16, so that a concave groove is formed along the side surfaces of the image sensor 11 on the outer periphery of the sealing resin 14.

As illustrated in FIG. 1A, for example, the reinforcing resin 15 is formed so as to surround the outer periphery of the sealing resin 14, and bonds the sensor substrate 13 and the sealing glass 16 together to reinforce the bond strength therebetween. That is, as illustrated in FIG. 1B, the reinforcing resin 15 is formed to fill the gap between the sensor substrate 13 and the sealing glass 16 facing each other, or to fill the groove formed along the side surfaces of the image sensor 11, the groove being formed due to the sealing resin 14 having the small area. A resin material having higher rigidity than the sealing resin 14 is used for the reinforcing resin 15, for example, and is cured to be formed into the reinforcing resin 15.

The sealing glass 16 molds the sensor surface 18 of the sensor substrate 13 airtight. Note that the sealing glass 16 may be formed of a member that transmits light and thus be a sealing member made of material other than glass.

The image sensor 11 configured as described above uses the sealing resin 14 having low rigidity as the main component bonding the sensor substrate 13 and the sealing glass 16 to thus be able to prevent warpage by thermal contraction at the time of curing the resin and a problem at the time of wafer transfer. Moreover, the image sensor 11 uses the reinforcing resin 15 having high rigidity to reinforce the bond strength between the sensor substrate 13 and the sealing glass 16 on the outer periphery of the sealing resin 14, thereby preventing the sealing resin 14 from peeling off in a low temperature reliability test. The reliability of the image sensor 11 can thus be improved.

Next, a method of manufacturing the image sensor 11 will be described with reference to FIGS. 2A, 2B, 2C, 2D, and 2E.

First, as illustrated in FIG. 2A, there is prepared a substrate 21 in a wafer state before being diced into the size of the image sensor 11. The substrate 21 is formed by bonding a support substrate layer 23 to the surface side of a sensor layer 22 on which the sensor surface 18 is formed for each image sensor 11, forming the through electrodes 17-1 and 17-2 in the support substrate layer 23 for each image sensor 11, and then applying a resin layer 24 to the back side of the sensor layer 22 to bond a glass layer 25 thereto.

In a first step, the substrate 21 is cut along a broken line to be formed into the image sensor 11 that is diced into a predetermined size as illustrated in FIG. 2B.

Next, in a second step, the resin on the outer periphery of the sealing resin 14 is removed by laser ablation or an encapsulation remover, for example. This step forms the image sensor 11 with the groove formed by the sealing resin 14 on the side surfaces of the sensor, as illustrated in FIG. 2C.

Then in a third step, a jet dispenser is used to apply a resin material, which is to be the reinforcing resin 15, to the groove formed by the sealing resin 14, and then the resin material is cured to be formed into the reinforcing resin 15 as illustrated in FIG. 2D. As a result, the sensor substrate 13 and the sealing glass 16 are bonded to each other by the reinforcing resin 15 on the outer periphery of the sealing resin 14, whereby the image sensor 11 as illustrated in FIGS. 1A and 1B is formed.

After that, in a fourth step, the through electrodes 17-1 and 17-2 of the image sensor 11 are electrically connected to a mounting substrate 31 by solder 32-1 and 32-2 as illustrated in FIG. 2E.

Note that in applying the resin material with the jet dispenser, the resin material may be applied in a larger amount so as to protrude from the groove formed by the sealing resin 14 and then be cured, as illustrated in FIG. 3A. Such application of the resin material forms a reinforcing resin 15' bulging out from the side surface of the image sensor 11. After that, as illustrated in FIG. 3B, the sealing resin 14 is made flush with the sensor substrate 13 and the sealing glass 16 by a method of removing the protruding portion of the resin material by laser ablation or polishing, whereby the side surface of the image sensor 11 can be made flat. It goes without saying that, instead of using such a method, the reinforcing resin 15 may be formed by adjusting the amount of the resin material applied such that the resin material fills only the groove formed by the sealing resin 14.

The manufacturing method including the aforementioned steps can manufacture the image sensor 11 with high reliability as described above.

The image sensor 11 for example uses the groove formed by the sealing resin 14 to be able to let the resin material for forming the reinforcing resin 15 stay in the groove. That is, the resin material applied to the side surface possibly drips in a configuration not including such a groove, whereas in the image sensor 11, the reinforcing resin 15 can be formed stably without the resin material dripping.

Moreover, the groove formed on the outer periphery of the sealing resin 14 is deep enough to prevent the reinforcing resin 15 from blocking the light condensed on the sensor surface 18 of the sensor substrate 13 through an optical system not shown, for example. Furthermore, the reinforcing resin 15 may be made of a resin material having higher rigidity than the sealing resin 14, preferably a resin material having the rigidity of about 10 to 100 times the rigidity of the sealing resin 14, for example.

Still furthermore, the configuration of the image sensor 11 is not limited to the aforementioned configuration in which the reinforcing resin 15 is formed in the groove as long as the reinforcing resin 15 can be formed to allow the sensor substrate 13 and the sealing glass 16 to be bonded to each other on the outer periphery of the sealing resin 14.

Figure 4A:
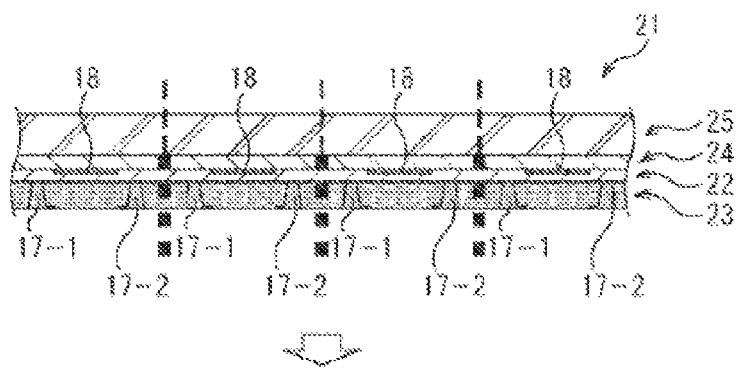
FIGS. 4A, 4B, and 4C are a set of diagrams illustrating a method of manufacturing an image sensor according to a second embodiment.
Figure 4B:
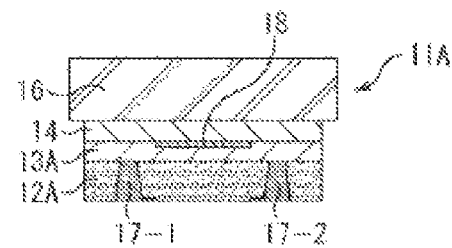
Figure 4C:
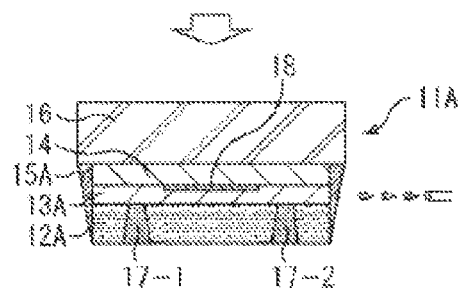

Next, FIGS. 4A, 4B, and 4C are a set of diagrams illustrating a method of manufacturing an image sensor 11A according to a second embodiment.

First, there is prepared a substrate 21 similar to that of FIG. 2A described above. Then in a first step, the substrate 21 is cut along a broken line so that the image sensor 11A diced into a predetermined size is formed. At this time, dicing blades with different thicknesses are used against the substrate 21 to cut out the image sensor 11A from both the side of a glass layer 25 and the side of a support substrate layer 23.

The thickness of the broken line illustrated in FIG. 4A represents the width of dicing cut, which is set narrow for the glass layer 25 and wide for a sensor layer 22, the support substrate layer 23, and a resin layer 24, for example.

Thus, as illustrated in FIG. 4B, the image sensor 11A is formed such that a support substrate 12A, a sensor substrate 13A, and a sealing resin 14 each have a smaller area than sealing glass 16. That is, the side surface of the sealing glass 16 is formed to protrude more on the outer side than the side surfaces of the support substrate 12A, the sensor substrate 13A, and the sealing resin 14 so that a difference in level is formed between the side surface of the sealing glass 16 and the side surfaces of the support substrate 12A, the sensor substrate 13A, and the sealing resin 14.

Then in a second step, a jet dispenser is used to apply a resin material to be a reinforcing resin 15A, and then the resin material is cured to be formed into the reinforcing resin 15A as illustrated in FIG. 4C. The image sensor 11A is formed as a result.

At this time, the support substrate 12A, the sensor substrate 13A, and the sealing resin 14 are each formed to have a smaller area than the sealing glass 16 so that the difference in level is formed between the side surfaces of the support substrate 12A, the sensor substrate 13A, and the sealing resin 14 and the side surface of the sealing glass 16. The reinforcing resin 15A is formed to fill such a difference in level. That is, the reinforcing resin 15A is formed so as to bond the side surfaces of the support substrate 12A, the sensor substrate 13A, and the sealing resin 14 to the bottom surface of the sealing glass 16. Although not shown, the image sensor 11A is thereafter connected to a mounting substrate 31 as is the case in FIG. 2E.

The manufacturing method including the aforementioned steps can manufacture the image sensor 11A with high reliability similar to the image sensor 11 of FIGS. 1A and 1B.

Figure 5A:
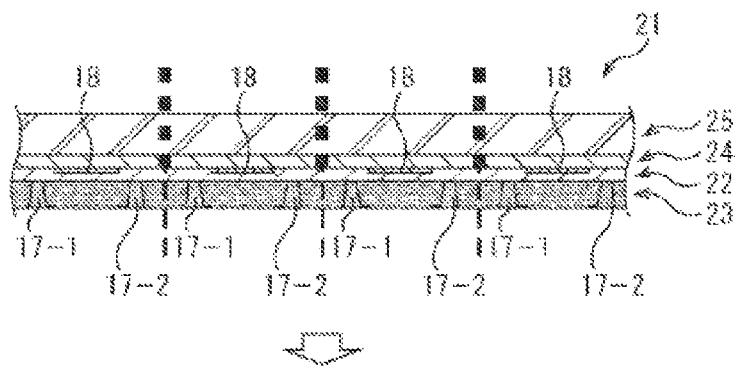
FIGS. 5A, 5B, and 5C are a set of diagrams illustrating a method of manufacturing an image sensor according to a third embodiment.
Figure 5B:
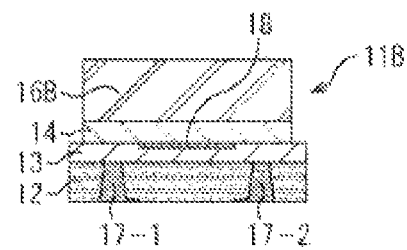
Figure 5C:
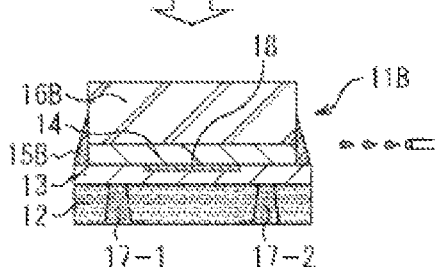

Next, FIGS. 5A, 5B, and 5C are a set of diagrams illustrating a method of manufacturing an image sensor 11B according to a third embodiment.

First, there is prepared a substrate 21 similar to that of FIG. 2A described above. Then in a first step, the substrate 21 is cut along a broken line so that the image sensor 11B diced into a predetermined size is formed. At this time, dicing blades with different thicknesses are used against the substrate 21 to cut out the image sensor 11B from both the side of a glass layer 25 and the side of a support substrate layer 23.

The thickness of the broken line illustrated in FIG. 5A represents the width of dicing cut, which is set wide for a resin layer 24 and the glass layer 25 and narrow for a sensor layer 22 and the support substrate layer 23, for example.

Thus, as illustrated in FIG. 5B, the image sensor 11B is formed such that a sealing resin 14 and sealing glass 16B each have a smaller area than each of a support substrate 12 and a sensor substrate 13. That is, the side surfaces of the support substrate 12 and the sensor substrate 13 are formed to protrude more on the outer side than the side surfaces of the sealing resin 14 and the sealing glass 16B, so that a difference in level is formed between the side surfaces of the support substrate 12 and sensor substrate 13 and the side surfaces of the sealing resin 14 and sealing glass 16B.

Then in a second step, a jet dispenser is used to apply a resin material to be a reinforcing resin 15B, and then the resin material is cured to be formed into the reinforcing resin 15B as illustrated in FIG. 5C. The image sensor 11B is formed as a result.

At this time, the sealing resin 14 and the sealing glass 16B are each formed to have a smaller area than each of the support substrate 12 and the sensor substrate 13 so that the difference in level is formed between the side surfaces of the sealing resin 14 and sealing glass 16B and the side surfaces of the support substrate 12 and sensor substrate 13. The reinforcing resin 15B is formed to fill such a difference in level. That is, the reinforcing resin 15B is formed so as to bond the side surfaces of the sealing resin 14 and the sealing glass 16B to the upper surface of the sensor substrate 13. Although not shown, the image sensor 11B is thereafter connected to a mounting substrate 31 as is the case in FIG. 2E.

The manufacturing method including the aforementioned steps can manufacture the image sensor 11B with high reliability similar to the image sensor 11 of FIGS. 1A and 1B.

Next, FIGS. 6A, 6B, 6C, and 6D are a set of diagrams illustrating a method of manufacturing an image sensor 11C according to a fourth embodiment.

Figure 6A:
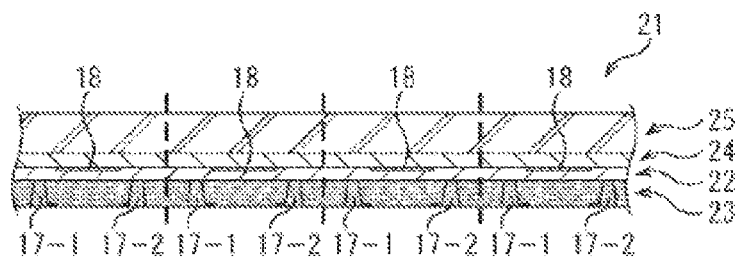
FIGS. 6A, 6B, 6C, and 6D are a set of diagrams illustrating a method of manufacturing an image sensor according to a fourth embodiment.

First, there is prepared a substrate 21 as illustrated in FIG. 6A similar to that of FIG. 2A described above. Then in a first step, the substrate 21 is cut along a broken line so that the image sensor 11C diced into a predetermined size is formed.

Figure 6B:
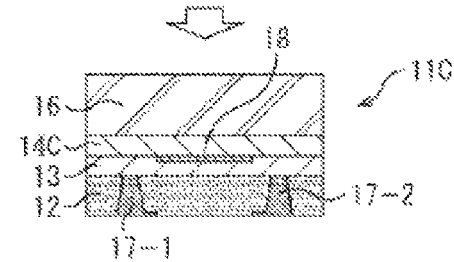

As a result, the image sensor 11C with a flat side surface is formed as illustrated in FIG. 6B. Note that the image sensor 11C is different from the image sensor 11 of FIGS. 1A and 1B in that a sealing resin 14C is formed to have the same area as each of a sensor substrate 13 and sealing glass 16 in plan view. That is, the side surface of the image sensor 11C is made flat without formation of a groove, a difference in level or the like.

Figure 6C:
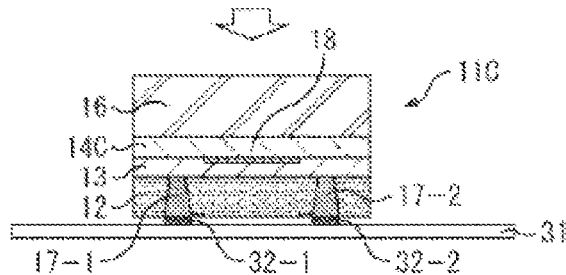

Then in a second step, through electrodes 17-1 and 17-2 of the image sensor 11C are electrically connected to a mounting substrate 31 by solder 32-1 and 32-2 as illustrated in FIG. 6C.

Figure 6D:
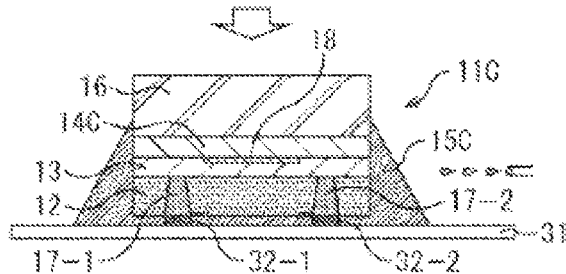

After that, in a third step, as illustrated in FIG. 6D, a jet dispenser is used to fill a gap between the image sensor 11C and the mounting substrate 31 while applying a resin material to be a reinforcing resin 15C from the upper surface of the mounting substrate 31 up to the side surface of the image sensor 11C, and then the resin material is cured to be formed into the reinforcing resin 15C. The reinforcing resin 15C is thus formed to bond the sensor substrate 13 and the sealing glass 16 together.

That is, the image sensor 11C uses as the reinforcing resin 15C an underfill material filling the gap between the image sensor 11C and the mounting substrate 31. Here, the underfill material made of a resin material having higher rigidity than the sealing resin 14 is generally applied to the gap between the image sensor 11C and the mounting substrate 31 for the purpose of preventing oxidation of solder or cracks of solder at the time of impact, and is used for protecting the solder. The underfill material thus has rigidity higher than that of the sealing resin 14, or rigidity suitable for use as the reinforcing resin 15C. Accordingly, the underfill material is used as the reinforcing resin 15C and applied at once to be able to form the reinforcing resin 15C without adding a new step.

Moreover, the image sensor 11C not provided with a groove or difference in level on the side surface can use the upper surface of the mounting substrate 31 to pile up the resin material at least up to a part of the sealing glass 16 to be able to form the reinforcing resin 15C that bonds the sensor substrate 13 and the sealing glass 16 together.

The manufacturing method including the aforementioned steps can manufacture the image sensor 11C with high reliability similar to the image sensor 11 of FIGS. 1A and 1B. Moreover, the image sensor 11C can be combined with the image sensor 11 of FIGS. 1A and 1B to form a groove similar to that of the image sensor 11 of FIGS. 1A and 1B on the side surface of the image sensor 11C. That is, the reinforcing resin 15C can be formed so as to fill the groove as well as to bond the side surface of the image sensor 11C and the mounting substrate 31. Likewise, the image sensor 11C may be combined with the image sensor 11A of FIGS. 4B and 4C or the image sensor 11B of FIGS. 5B and 5C.

Note that the image sensor 11 according to the aforementioned embodiments can be applied to various electronic apparatuses including an imaging system such as a digital still camera or a digital video camera, a mobile phone equipped with an imaging function, or another device equipped with the imaging function, for example.

Figure 7:
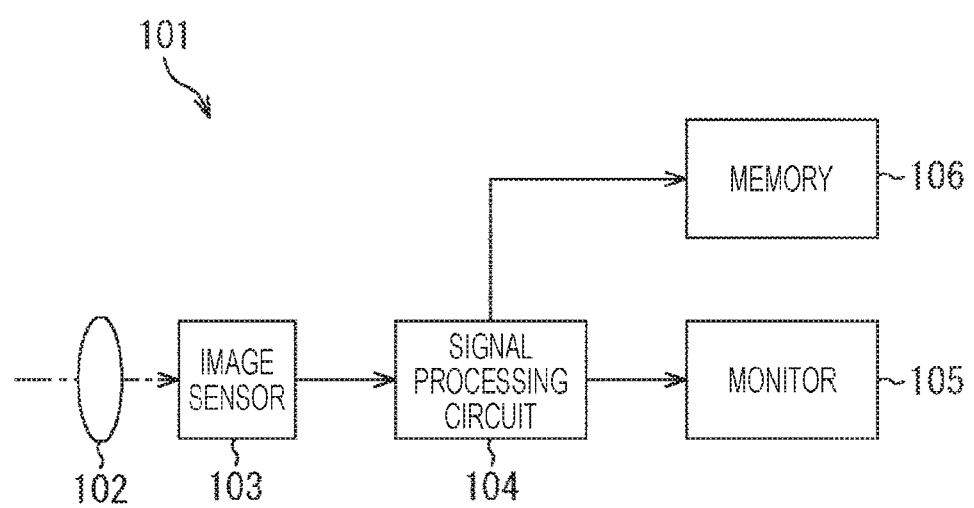
FIG. 7 is a block diagram illustrating an example of the configuration of an embodiment of an imaging device to which the present technology is applied.

FIG. 7 is a block diagram illustrating an example of the configuration of an imaging device mounted in an electronic apparatus.

As illustrated in FIG. 7, an imaging device 101 includes an optical system 102, an image sensor 103, a signal processing circuit 104, a monitor 105, and a memory 106, and is capable of imaging still images and moving images.

The optical system 102 includes one or a plurality of lenses to guide image light (incident light) from a subject to the image sensor 103 and form an image on a light-receiving surface (sensor part) of the image sensor 103.

The image sensor 11 of the aforementioned embodiments is applied as the image sensor 103. The image sensor 103 accumulates electrons for a certain period of time in accordance with the image formed on the light-receiving surface via the optical system 102. A signal corresponding to the electrons accumulated in the image sensor 103 is then supplied to the signal processing circuit 104.

The signal processing circuit 104 performs various types of signal processing on a pixel signal output from the image sensor 103. An image (image data) obtained after the signal processing performed by the signal processing circuit 104 is supplied to the monitor 105 and displayed thereon or supplied to the memory 106 and stored (recorded) therein.

The imaging device 101 configured as described above uses the image sensor 11 of the aforementioned embodiments to be able to perform imaging more reliably as a result of the improvement in the reliability of the image sensor 11.

Figure 8:
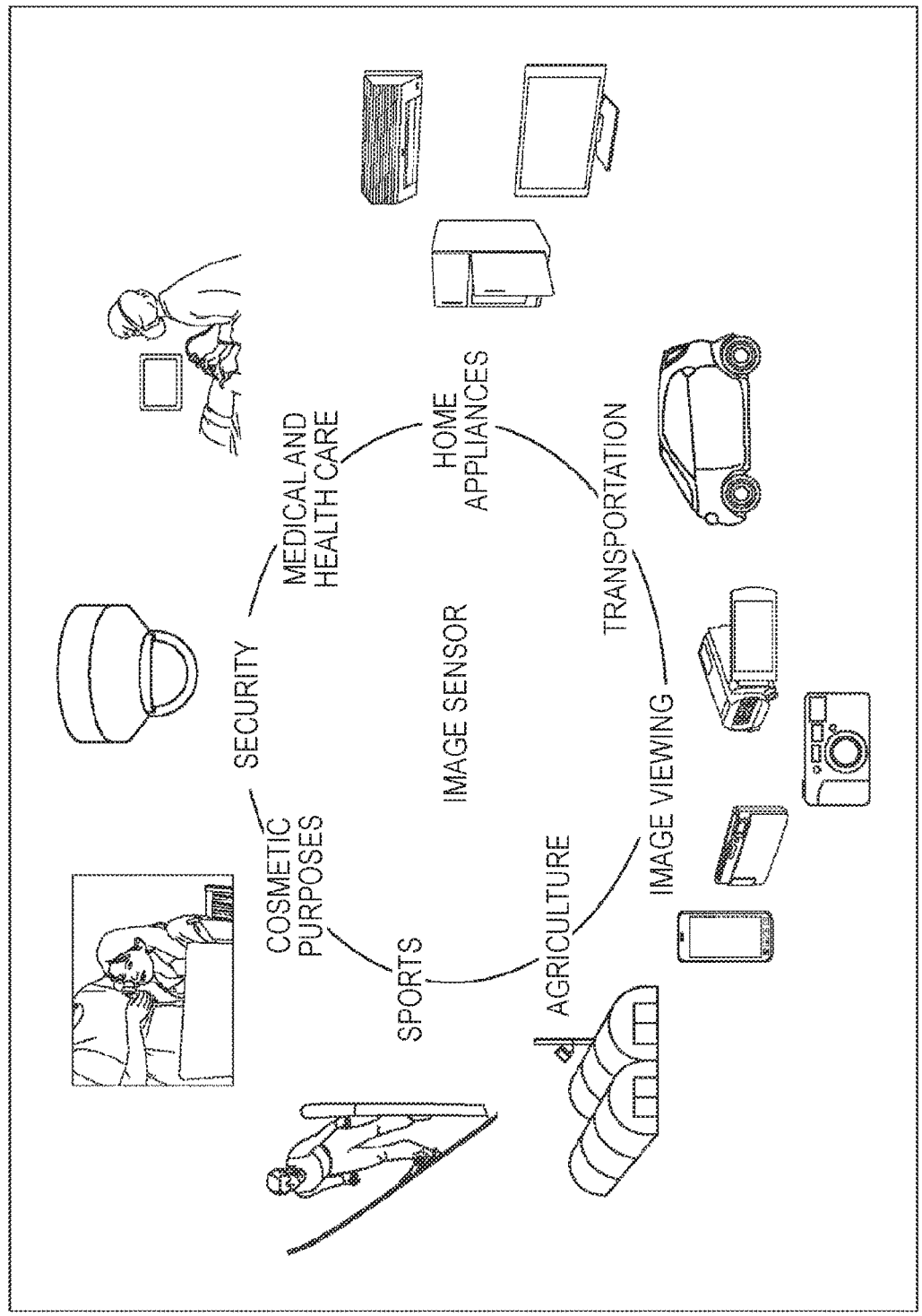
FIG. 8 is a diagram illustrating an example in which an image sensor is used.

FIG. 8 is a diagram illustrating an example in which the aforementioned image sensor (image sensor 11) is used.

The aforementioned image sensor can be used in various cases for sensing light such as visible light, infrared light, ultraviolet light, an X-ray, and the like as described below, for example.

- A device such as a digital camera or a portable device with a camera function for photographing an image to be used for viewing
- A device for use in transportation such as an in-vehicle sensor that photographs the front, back, periphery, interior and the like of a vehicle for safe driving such as automatic stop, recognizing the condition of a driver, or the like, a surveillance camera that monitors traveling vehicles and roads, or a range sensor that measures the distance between vehicles and the like
- A device for use in home appliances such as a TV, a refrigerator, and an air conditioner to photograph a gesture of a user and operate an appliance in accordance with the gesture
- A device for use in medical and health care such as an endoscope or a device that performs angiography by receiving infrared light
- A device for use in security such as a surveillance camera used for crime prevention or a camera used for person authentication
- A device for use in cosmetic purposes such as a skin measuring instrument that photographs skin or a microscope that photographs the scalp
- A device for use in sports such as an action camera or a wearable camera for sports applications and the like
- A device for use in agriculture such as a camera that monitors the condition of fields and crops Note that the present technology can also be embodied in the following configurations.

(1)

An image sensor including:

a sensor substrate provided with a sensor surface on which a photodiode is arranged in a planar manner;

a seal member applied to a side of the sensor surface of the sensor substrate;

a sealing member bonded to the sensor substrate via the seal member; and a reinforcing member made of a material having higher rigidity than the seal member and formed on an outer periphery of the seal member to bond the sensor substrate and the sealing member.

(2)

The image sensor according to (1), in which the seal member is formed to have a smaller area than each of the sensor substrate and the sealing member to be provided with a gap on the outer periphery of the seal member, the sensor substrate and the sealing member facing each other through the gap, and the reinforcing member is formed to fill the gap.

(3)

The image sensor according to (1), in which the seal member and the sensor substrate are each formed to have a smaller area than the sealing member to be provided with a difference in level between side surfaces of the seal member and the sensor substrate and a side surface of the sealing member, and the reinforcing member is formed to fill the difference in level.

(4)

The image sensor according to (1), in which the sealing member is formed to have a smaller area than each of the seal member and the sensor substrate to be provided with a difference in level between a side surface of the sealing member and side surfaces of the seal member and the sensor substrate, and the reinforcing member is formed to fill the difference in level.

(5)

The image sensor according to any one of (1) to (4), further including:

a support substrate bonded to a surface of the sensor substrate opposite to a surface to which the sealing member is bonded, in which the reinforcing member is formed to fill a gap between a mounting substrate to which the support substrate is electrically connected and the support substrate, and to bond the sensor substrate and the sealing member.

(6)

A method of manufacturing an image sensor in which a sensor substrate provided with a sensor surface on which a photodiode is arranged in a planar manner is bonded to a sealing member via a seal member on a side of the sensor surface of the sensor substrate, the method including:

a step of forming, on an outer periphery of the seal member, a reinforcing member made of a material having higher rigidity than the seal member to bond the sensor substrate and the sealing member.

(7)

An electronic apparatus equipped with an image sensor including:

a sensor substrate provided with a sensor surface on which a photodiode is arranged in a planar manner;

a seal member applied to a side of the sensor surface of the sensor substrate;

a sealing member bonded to the sensor substrate via the seal member; and a reinforcing member made of a material having higher rigidity than the seal member and formed on an outer periphery of the seal member to bond the sensor substrate and the sealing member.

Note that the present embodiment is not limited to the aforementioned embodiment, where various modifications can be made without departing from the scope of the present disclosure.

REFERENCE SIGNS LIST

11 Image sensor
12 Support substrate
13 Sensor substrate
14 Sealing resin
15 Reinforcing resin
16 Sealing glass
17-1 and 17-2 Through electrode
18 Sensor surface
21 Substrate
22 Sensor layer
23 Support substrate layer
24 Resin layer
25 Glass layer
31 Mounting substrate
32-1 and 32-2 Solder

The invention claimed is:

1. An image sensor, comprising:
a sensor substrate that includes a sensor surface;
a photodiode arranged in a planar manner on the sensor surface;
a seal member on a first side of the sensor substrate;
a sealing member bonded to the sensor substrate via the seal member, wherein the seal member has a width that is smaller than a width of each of the sensor substrate and the sealing member to define a groove in a side surface of the image sensor;
a support substrate bonded to a second side of the sensor substrate opposite to the sensor surface, wherein the support substrate includes through electrodes configured to electrically connect the image sensor to a mounting substrate; and
a reinforcing member including a material having a rigidity higher than a rigidity of a material of the seal member, wherein
the reinforcing member extends from an upper surface of the mounting substrate to a lower part of a side surface of the sealing member,
the reinforcing member contacts a side surface of the sensor substrate and contacts the lower part of the side surface of the sealing member such that the reinforcing member bonds the sensor substrate and the sealing member, and
the reinforcing member fills the groove in the side surface of the image sensor and a gap between the mounting substrate and the support substrate.

2. The image sensor according to claim 1, wherein
each of the seal member and the sensor substrate has a smaller area than the sealing member to define a difference in a level between the side surface of the sealing member and each of a side surface of the seal member and the side surface of the sensor substrate, and
the reinforcing member fills the difference in the level.

3. The image sensor according to claim 1, wherein
each of the sealing member and the seal member has a smaller area than the sensor substrate to define a difference in a level between the side surface of the sensor substrate and each of the side surface of the sealing member and a side surface of the seal member, and
the reinforcing member fills the difference in the level.

4. The image sensor according to claim 1, wherein the material of the reinforcing member has the rigidity of about 10 to 100 times the rigidity of the material of the seal member.

5. An image sensor, comprising:
a sensor substrate that includes a sensor surface;
a photodiode arranged in a planar manner on the sensor surface;
a seal member on a first side of the sensor substrate;
a sealing member bonded to the sensor substrate via the seal member, wherein a side surface of the sealing member protrudes more on an outer periphery than each of a side surface of the seal member and a side surface of the sensor substrate to define a difference in a level between the side surface of the sealing member and each of the side surface of the seal member and the side surface of the sensor substrate;

a support substrate bonded to a second side of the sensor substrate opposite to the sensor surface, wherein a width of the support substrate is equal to a width of the seal member and a width of the sensor substrate, and each of the seal member, the sensor substrate, and the support substrate has a smaller area than the sealing member; and a reinforcing member including a material having a rigidity higher than a rigidity of a material of the seal member, wherein the reinforcing member is in contact with each of a side surface of the support substrate, the side surface of the seal member, and the side surface of the sensor substrate, the reinforcing member is in contact with a bottom surface of the sealing member to bond each of the side surface of the sensor substrate and the side surface of the seal member to the bottom surface of the sealing member, and the reinforcing member fills the difference in the level.

* * * * *